United States Patent [19]
Batson et al.

[11] Patent Number: 6,011,726
[45] Date of Patent: *Jan. 4, 2000

[54] FOUR DEVICE SRAM CELL WITH SINGLE BITLINE

[75] Inventors: Kevin Arthur Batson, Williston, Vt.; Robert Anthony Ross, Jr., Cedar Park, Tex.

[73] Assignee: International Business Machines Corporation, Armonk, N.Y.

[ * ] Notice: This patent is subject to a terminal disclaimer.

[21] Appl. No.: 08/996,924

[22] Filed: Dec. 23, 1997

Related U.S. Application Data

[63] Continuation of application No. 08/773,561, Dec. 27, 1996, Pat. No. 5,805,496.

[51] Int. Cl.$^7$ ..................................................... G11C 11/34
[52] U.S. Cl. ...................... 365/188; 365/154; 365/189.04
[58] Field of Search ............................. 365/188, 72, 104, 365/230.06, 154, 189.04

[56] References Cited

U.S. PATENT DOCUMENTS 5,805,496   9/1998   Batson et al. ............................ 365/154

*Primary Examiner*—David Nelms
*Assistant Examiner*—Thong Le
*Attorney, Agent, or Firm*—Robert A. Walsh

[57] ABSTRACT

A memory cell includes a static inverter having an input connected to a storage node. An impedance connects the storage node to a voltage supply. A first transistor, having an input connected to an output of the static inverter, connects the storage node to a write line. Lastly, a second transistor, responsive to a wordline access signal, connects the storage node to a single data bitline. The memory cell further includes a single ended four transistor CMOS SRAM cell. Additionally, a memory array is disclosed which includes a plurality of memory cells arranged to form a matrix of rows and columns, each memory cell including a single ended four transistor CMOS SRAM cell.

8 Claims, 6 Drawing Sheets

FOUR DEVICE SRAM CELL WITH SINGLE BITLINE

This application is a Continuation of application Ser. No. 08/773,561 filed Dec. 27, 1996, now U.S. Pat. No. 5,805,496.

BACKGROUND OF THE INVENTION

1. Field of the Invention

This invention relates generally to static memory devices and, more particularly, to a four device static random access memory device having a single bitline.

2. Discussion of the Related Art

Various configurations of static random access memory (SRAM) memory cells have been designed/developed to reduce silicon area by eliminating devices where smaller array size is needed. FIG. 1 illustrates a basic six transistor full CMOS SRAM cell 10, as is known in the art. Data is stored in the cell 10 as voltage levels with the two sides of a bistable transistor flip-flop (i.e., latch) in opposite voltage configurations. For example, node A is high and node B is low in one state; whereas, node A is low and node B is high in the opposite state resulting in two stable states (i.e., bistable).

One approach taken to reduce the basic six transistor full CMOS cell is shown in FIG. 2. FIG. 2 shows a single-ended five transistor static CMOS cell 20. The five transistor CMOS cell 20 contains one less transistor and one less bitline per cell than the more common six transistor cell. In the five transistor configuration, writing a '1' into the cell 20 is difficult because the transistor T5 separating the cell from the bitline (i.e., the transfer transistor) operates in a source follower mode, thereby limiting the voltage transferred from the bitline to the cell's internal node B. With the charge transfer from the bitline alone, it is difficult to overwrite a previously written '0' in the cell to a '1'.

Another approach taken to reduce the basic six transistor CMOS cell is shown in FIG. 3. FIG. 3 illustrates a four transistor static cell 30 with resistor load pull-up devices R0,R1, further referred to as an R-load SRAM cell. This cell configuration reduces the cell size of the more common six device SRAM by two transistors. However, the resulting cell 30 has higher current leakage when not being accessed (i.e., in a standby mode) than the six transistor full CMOS SRAM cell, since a small amount of current always flows through the resistors R0,R1. For any of the two given stable states within the cell 30, one resistor functions to pull-up and offset the charge leakage of the drains of the storage and transfer transistors while the other resistor functions as a load to limit the current to the low ('0') node.

Continuing with the above evolution in cell device reduction, the next logical reduction would be to reduce the number of transistors to three, one less than the R-load SRAM cell 30 previously discussed. FIG. 4 shows one such cell configuration in which three transistors Q4,Q5,Q6 are used to create a single ended three device R-load cell 40. The single ended three device R-load cell 40 configuration shares the same concerns common to the five device CMOS SRAM cell 20 discussed earlier. In addition to writing a '1', the cell configuration 40 of FIG. 4 also has difficulty in writing a '0' reliably, if at all. The passive resistors R0,R1 of the three device R-load cell 40 must be very high, in the range of 10 to 100 G ohms, to keep a standby power dissipation as low as possible. Therefore, the recovery time of these resistors is far too slow to adequately pull-up and/or maintain stable high levels within the cell 40.

It is thus desirable to provide a smaller SRAM cell with a minimum impact on performance.

SUMMARY OF THE INVENTION

It is an object of the present invention to overcome the problems in the art as discussed above.

In accordance with the present invention, a memory cell includes a static inverter having an input connected to a storage node. An impedance connects the storage node to a voltage supply. A first transistor, having an input connected to an output of the static inverter, connects the storage node to a write line. Lastly, a second transistor, responsive to a wordline access signal, connects the storage node to a single data bitline. The memory cell further includes a single ended four transistor CMOS SRAM cell.

In further accordance with the present invention, a memory array includes a plurality of memory cells arranged to form a matrix of rows and columns, each memory cell including a single ended four transistor CMOS SRAM cell in accordance with the present invention.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
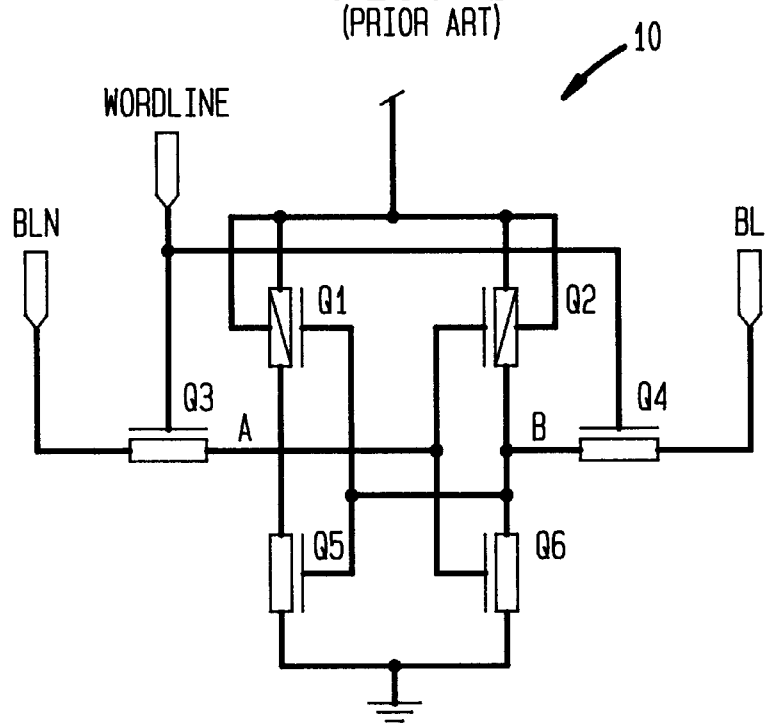
FIG. 1 illustrates a common six transistor full CMOS SRAM cell.
Figure 2:
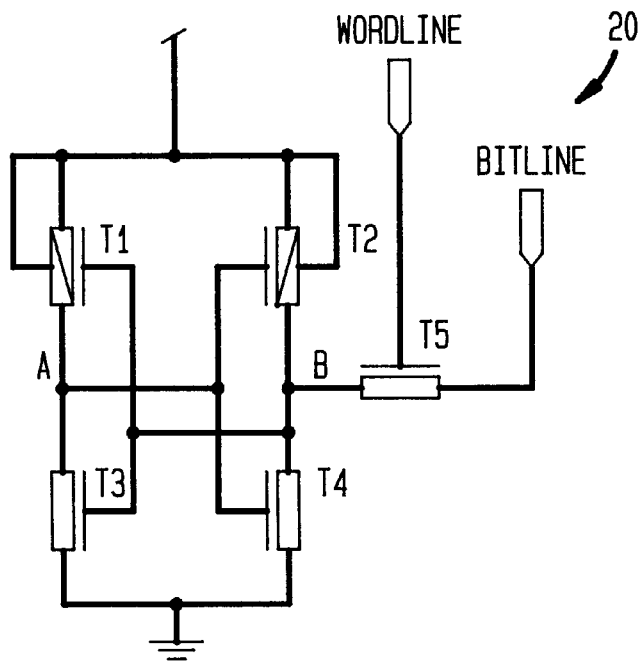
FIG. 2 illustrates a single ended five transistor CMOS SRAM cell.
Figure 5:
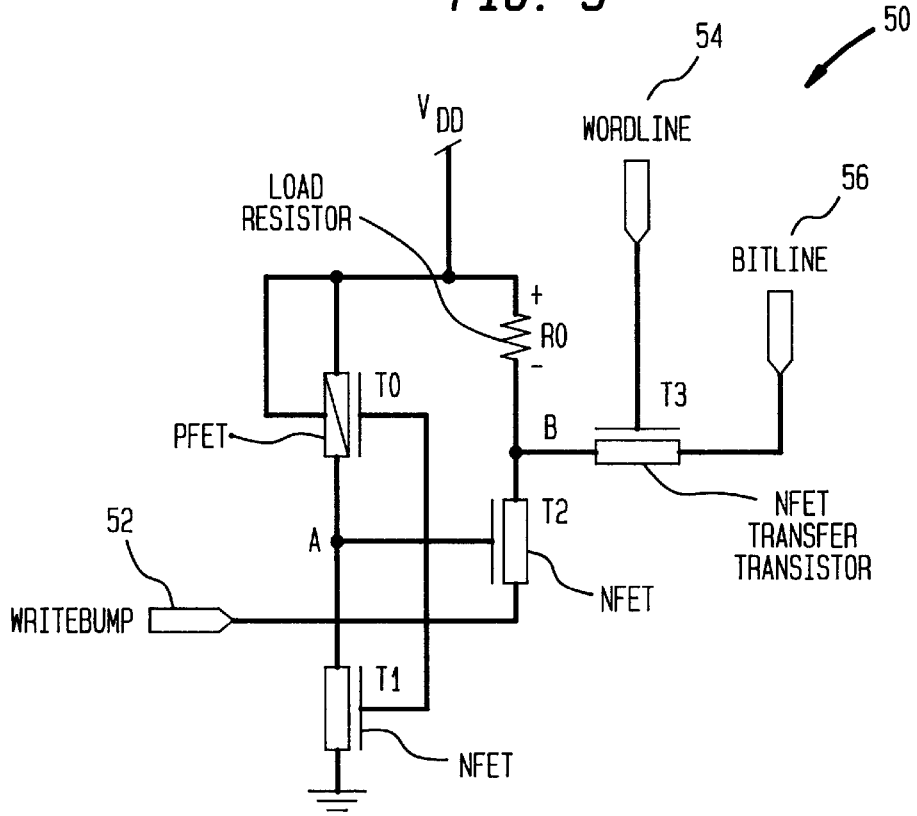
FIG. 5 illustrates a single ended four transistor CMOS SRAM cell in accordance with the present invention.

Turning now to FIG. 5, a single ended four transistor SRAM CMOS cell 50 in accordance with the present invention contains one less transistor than the more conventional five transistor device single ended CMOS SRAM cell 20 as shown and discussed herein above with reference to FIG. 2. In the single ended four transistor SRAM CMOS cell 50 in accordance with the present invention, one of two PFET load devices has been replaced with a polysilicon load resistor R0 to reduce the cell size further. Furthermore, a reliable write access into the cell 50 is provided by the addition of a 'WRITEBUMP' port 52 into each cell 50 within an SRAM cell memory array.

Figure 6:
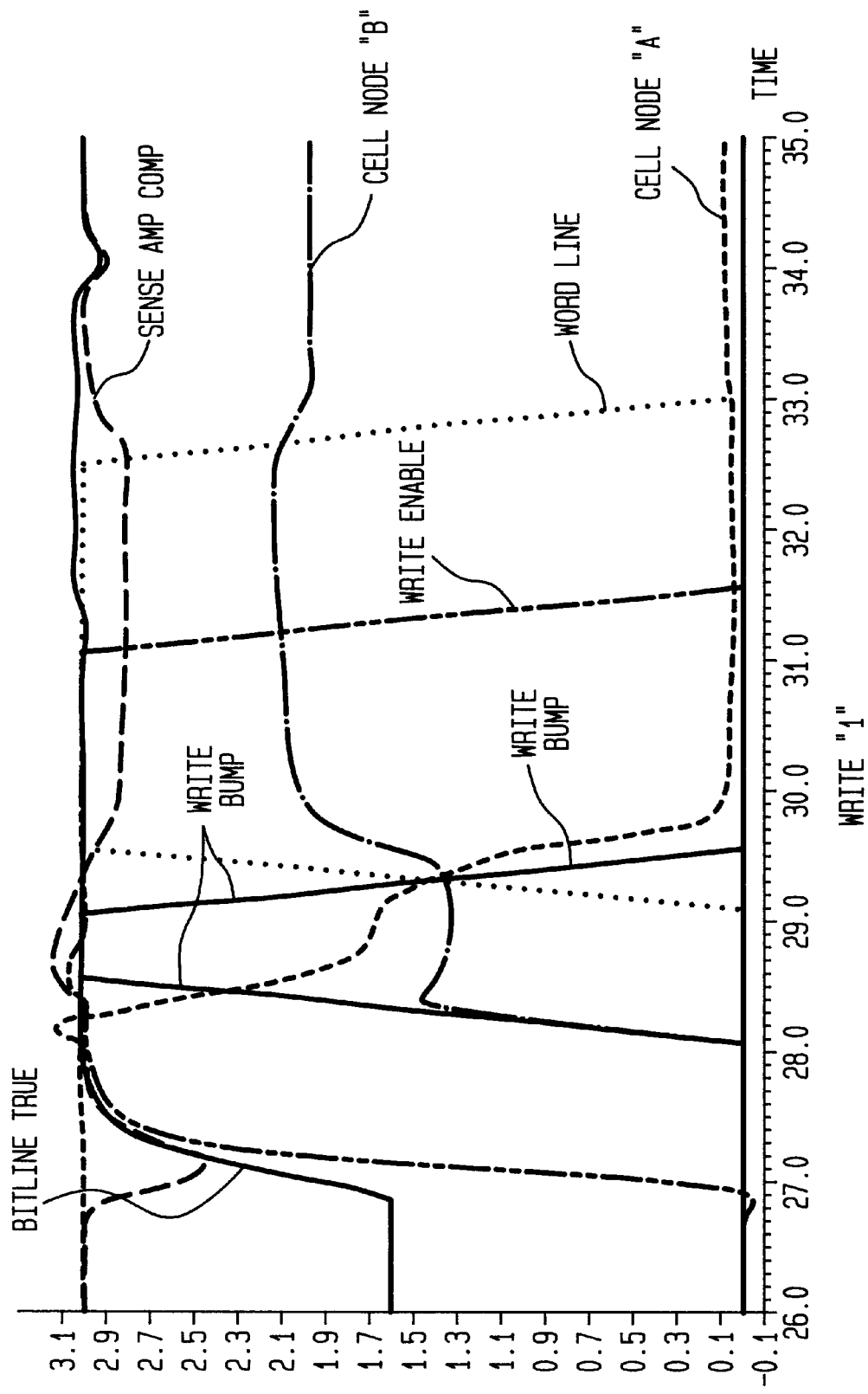
FIG. 6 illustrates a voltage vs. time characteristic for a write '1' operation of the single ended four transistor CMOS SRAM cell in accordance with the present invention.

A 'WRITEBUMP' signal includes a one-shot pulse, generated off a rising edge of the logical AND of a 'WRITE ENABLE' signal and a decoded 'WORDLINE' signal. That is, for every row of cells sharing a common wordline 54, there is a corresponding 'WRITEBUMP' pulse generated from its respective wordline and write enable. When a row of cells along a given wordline are designated to be written, the internal cell nodes 'A' and 'B' are effectively initialized to within a threshold voltage (Vt) of each other. FIG. 6 shows an internal node equalization process during a write '1' operation. With a '0' previously stored in the cell 50, the onset of the 'WRITEBUMP' pulse operates transistor T2 in a source follower mode pulling up cell node 'B'. As cell node 'B' begins to pull up, cell node 'A' begins to pull down with the activation of transistor T1. Cell node 'B' continues to pull up to approximately one-half the supply voltage, while cell node 'A' continues to pull down, clamping the two internal nodes A,B to within a threshold voltage (Vt) of each other.

During a write cycle, with a 'WORDLINE' 54 selected, the NFET transistor T3 between the cell 50 and the bitline 56 operates in a source follower mode transferring charge from the bitline 56 into the cell 50. Cell node 'B' pulls up to a threshold below the supply voltage VDD, while cell node 'A' continues to pull down toward ground GND. Further into the write cycle, the wordline 54 is de-selected and the bitline transfer device T3 isolates the cell 50 from the bitline 56. While the cell 50 remains isolated, the load resistor R0 must supply current to maintain the high node near the supply voltage in spite of any current leakage to ground or substrate. These leakages include a sub-threshold leakage of the inactive bitline transfer device (transistor T3 in FIG. 5), a sub-threshold leakage of the inactive storage transistor (transistor T2 in FIG. 5) and a leakage to substrate of the P-N diode created by a common drain diffusion.

Figure 7:
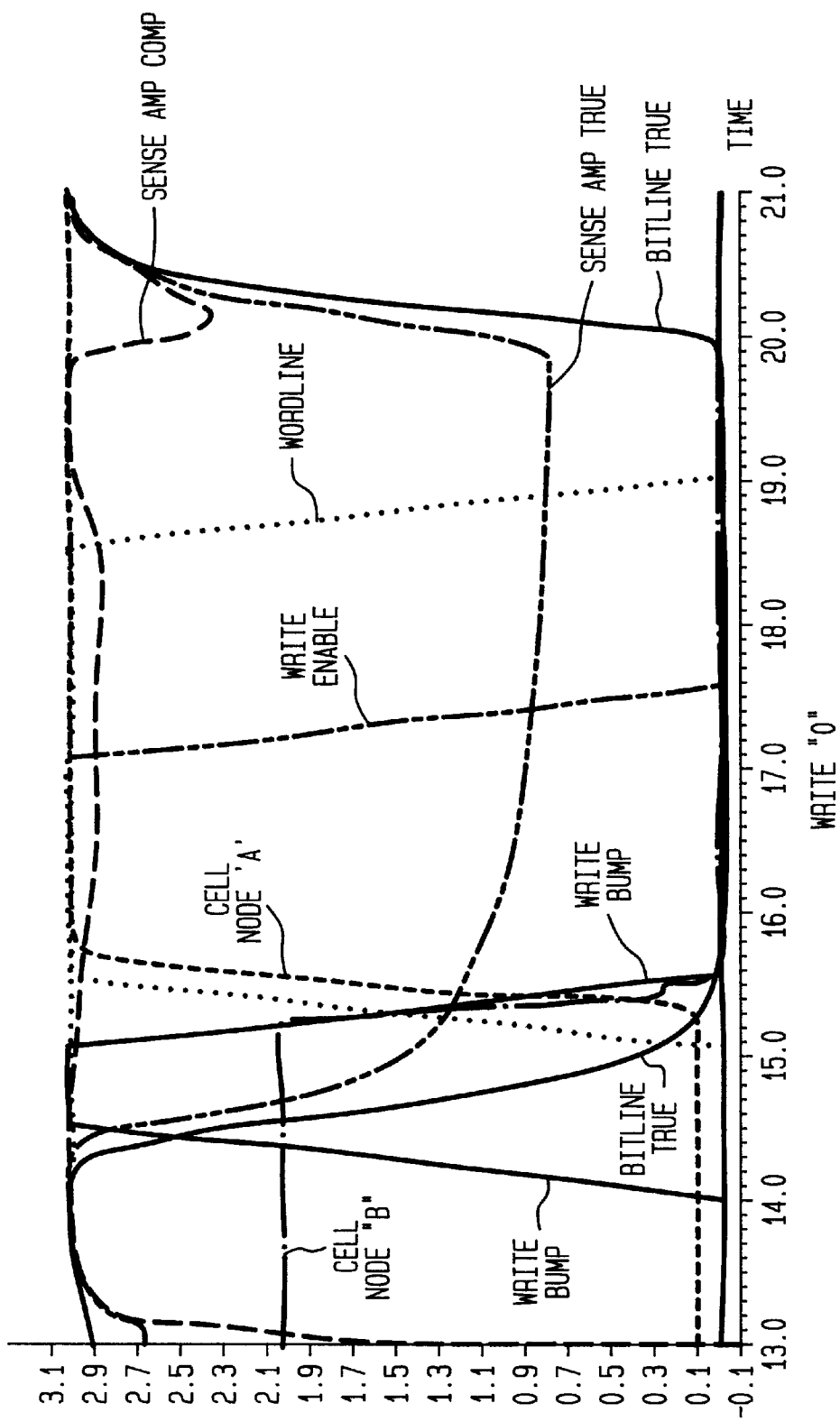
FIG. 7 illustrates a voltage vs. time characteristic for a write '0' operation of the single ended four transistor CMOS SRAM cell in accordance with the present invention.

FIG. 7 is illustrative of the internal node equalization process during a write '0' operation. With a '1' previously stored in the cell 50, the 'WRITEBUMP' pulse has no effect on the internal cell node 'B' since the storage transistor T2 (FIG. 5) is inactive. A valid 'WORDLINE' select grounds cell node 'B' through the transfer transistor T3 (FIG. 5) to the grounded bitline 56 during a write '0' operation. For a write '0' operation, both internal cell nodes 'A' and 'B' are rail to rail (i.e., VDD and GND, respectively).

With a de-selection of the wordline 54, the now isolated cell 50 maintains a stable state in much the same way as the six transistor CMOS SRAM cell. The cross-coupled NMOS transistor 'T0' and PMOS transistor 'T3' (FIG. 5) maintain a binary '0' in the cell 50. The value of the load/pullup resistor R0 is sufficiently high (i.e., on the order of 10 to 100 giga ohms) to minimize a standby power dissipation in the cell 50 for a stored '0'.

Figure 8:
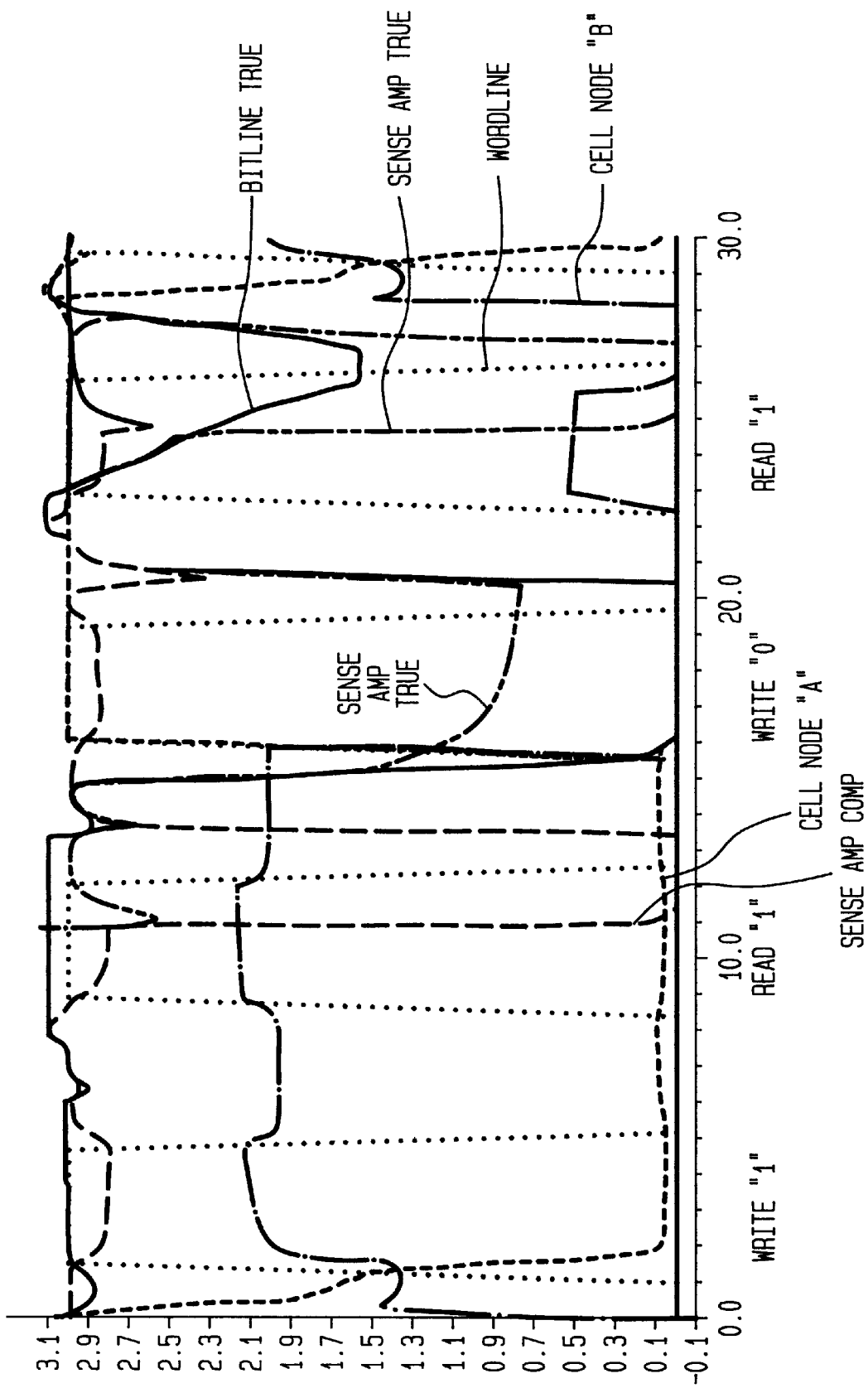
FIG. 8 illustrates a voltage vs. time characteristic for a write '1', read '1', write '0', read '1' sequence in the operation of the single ended four transistor CMOS SRAM cell in accordance with the present invention.
Figure 9:
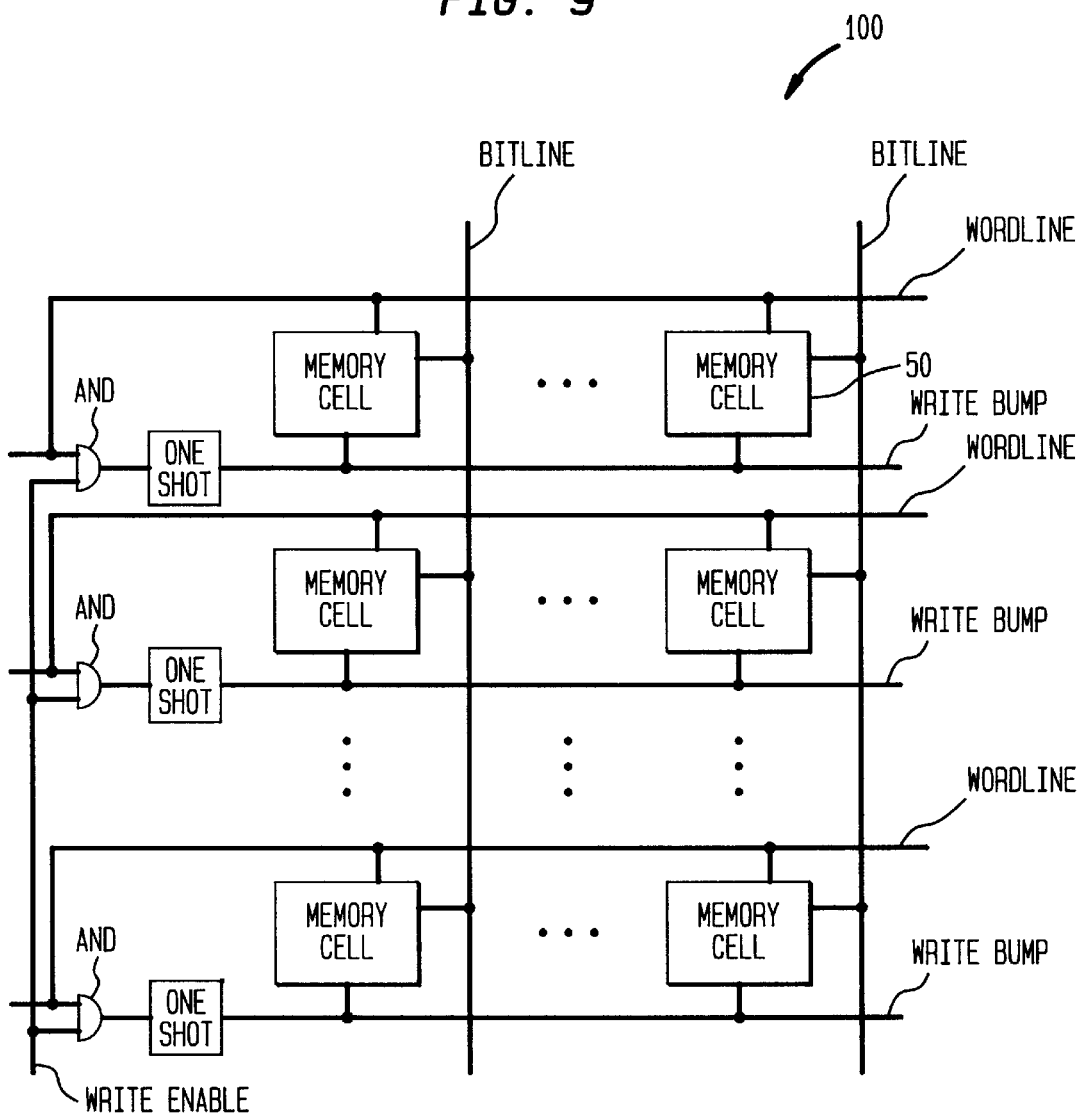
FIG. 9 illustrates a memory array having a plurality of memory cells arranged to form a matrix of rows and columns, each memory cell including a single ended four transistor CMOS SRAM cell in accordance with the present invention.

Reading a '1' or '0' from the cell 50 is accomplished by incorporation of a voltage reference node into a bitswitch circuit (not shown) that would allow a sense amplifier (not shown) to differentiate a '1' from a '0' while using only a single bitline per cell 50. Bitswitch circuits and sense amplifiers are known in the art and thus not further described herein. Turning now to FIG. 8, a 'WRITE 1', 'READ 1', 'WRITE 0', and 'READ 0' operation for the four transistor CMOS SRAM cell 50 in accordance with the present invention is shown. A voltage reference, labeled in FIG. 8 as 'SENSE AMP COMP', is generated at a voltage reference node during every read/write operation. The sense amplifier evaluates a differential between a 'BITLINE TRUE' node and the reference node 'SENSE AMP COMP' and amplifies a differential offset when a separate 'set' signal is applied to the sense amplifier during a read operation. A direction of the differential offset above or below the reference voltage level determines a '1' or s'0' to be stored in the cell 50.

Figure 3:
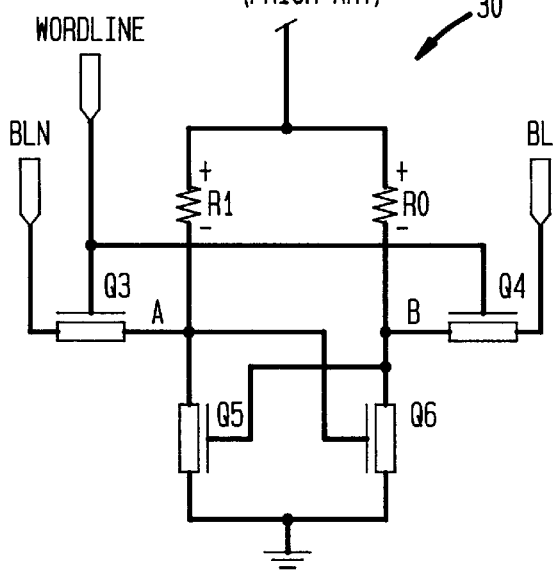
FIG. 3 illustrates a four transistor R-load CMOS SRAM cell.
Figure 4:
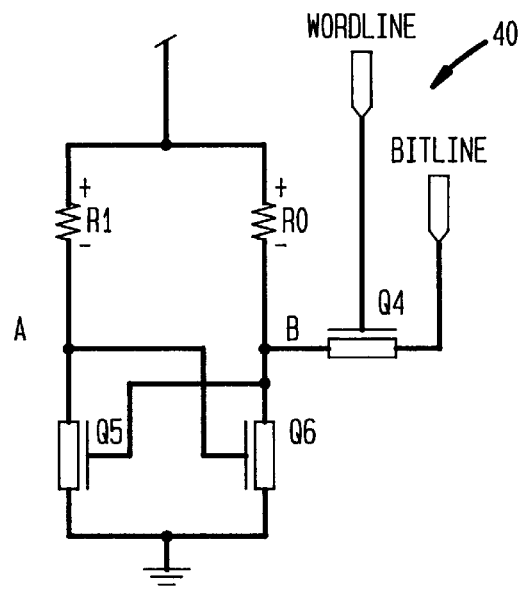
FIG. 4 illustrates a three transistor R-load CMOS SRAM cell.

A main advantage of the present invention is its small size. One less bitline and transfer transistor offers substantial array area savings at a time in the semiconductor industry/art when entire processors and memory are competing for the same silicon. The present invention advantageously overcomes the problems faced by the single ended five device predecessor. The 'WRITEBUMP' port 52 simplifies writing a '1' and makes the 'WRITE' operation more reliable than had previously been accomplished. Further reduction in cell size with the substitution of one of the two PMOS load transistors in the single ended five transistor CMOS SRAM cell (FIG. 2) with a poly load/pullup resistor (FIG. 5—four transistor CMOS SRAM cell) offers an additional level of silicon density improvement without any significant adverse performance impact and with less power dissipation than the more common two resistor R-load cell (FIG. 3).

There has thus been shown a four device SRAM cell with a single bitline which reduces the number of devices required for implementing a static memory latch for storing binary data. The four device SRAM cell further reduces the number of bitlines required from 2 to 1 for writing data to and reading data from the static memory latch/cell. The resultant memory cell improves a silicon area savings and furthermore provides for a more cost effective memory.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention.

Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A memory cell comprising:
   a static inverter having an input connected to a storage node;
   an impedance for connecting the storage node to a voltage supply;
   a first transistor having an input connected to an output of said static inverter, said first transistor further for connecting the storage node to a writebump port, the writebump port for receiving a write line signal for simplifying a writing of a logical "1" to the storage node; and
   a second transistor responsive to a wordline access signal for connecting the storage node to a single data bitline.

2. The memory cell of claim 1, wherein
   said static inverter includes a third transistor serially connected with a fourth transistor between the voltage supply and ground, wherein a respective base of the third and fourth transistors are connected and form the input of said static inverter, said static inverter further having a complementary storage node intermediate the serially connected third and fourth transistors.

3. The memory cell of claim 1, wherein said memory cell further comprises a single ended four device static random access memory cell having a single bitline.

4. A memory array having a plurality of memory cells arranged to form a matrix of rows and columns, each memory cell comprising:

a static inverter having an input connected to a storage node;

an impedance for connecting the storage node to a voltage supply;

a first transistor having an input connected to an output of said static inverter, said first transistor further for connecting the storage node to a writebump port, the writebump port for receiving a write line signal for simplifying a writing of a logical "1" to the storage node; and a second transistor responsive to a wordline access signal for connecting the storage node to a single data bitline.

5. The memory array of claim 4, wherein said static inverter includes a third transistor serially connected with a fourth transistor between the voltage supply and ground, wherein a respective base of the third and fourth transistors are connected and form the input of said static inverter, said static inverter further having a complementary storage node intermediate the serially connected third and fourth transistors.

6. The memory array of claim 4, wherein said memory cell further comprises a single ended four device static random access memory cell having a single bitline.

7. A memory cell comprising:

a static inverter having an input connected to a storage node;

an impedance for connecting the storage node to a voltage supply;

a first transistor having an input connected to an output of said static inverter, said first transistor further for connecting the storage node to a write line; and a second transistor responsive to a wordline access signal for connecting the storage node to a single data bitline, wherein the write line for receiving a one-shot pulse signal generated off of a rising edge of a logical AND of a 'WRITE ENABLE' signal and a decoded 'WORD-LINE' signal, and wherein said memory cell further comprises a single ended four device static random access memory cell having a single bitline.

8. The memory cell of claim 7, wherein said static inverter includes a third transistor serially connected with a fourth transistor between the voltage supply and ground, wherein a respective base of the third and fourth transistors are connected and form the input of said static inverter, said static inverter further having a complementary storage node intermediate the serially connected third and fourth transistors.

\* \* \* \* \*